United States Patent
Vijayaraghavan et al.

(10) Patent No.: US 7,772,833 B2
(45) Date of Patent: Aug. 10, 2010

(54) FLEXIBLE ON CHIP TESTING CIRCUIT FOR I/O'S CHARACTERIZATION

(75) Inventors: Narayanan Vijayaraghavan, Delhi (IN); Balwant Singh, Greater Noida (IN)

(73) Assignee: STMicroelectronics Pvt. Ltd., Greater Noida (IN)

( * ) Notice: Subject to any disclaimer, the term of this patent is extended or adjusted under 35 U.S.C. 154(b) by 0 days.

(21) Appl. No.: 12/135,418

(22) Filed: Jun. 9, 2008

(65) Prior Publication Data

US 2009/0076753 A1    Mar. 19, 2009

Related U.S. Application Data

(63) Continuation of application No. 11/875,837, filed on Oct. 20, 2007, now abandoned.

(30) Foreign Application Priority Data

Oct. 20, 2006    (IN) .................. 2312/DEL/2006

(51) Int. Cl.
*G01R 31/28* (2006.01)
(52) U.S. Cl. .................................. 324/158.1
(58) Field of Classification Search ............ None
See application file for complete search history.

(56) References Cited

U.S. PATENT DOCUMENTS

| | | | |
|---|---|---|---|
| 6,020,757 A * | 2/2000 | Jenkins, IV | 326/39 |
| 6,446,230 B1 * | 9/2002 | Chung | 714/726 |
| 6,560,739 B1 * | 5/2003 | Chung | 714/726 |
| 6,586,921 B1 * | 7/2003 | Sunter | 324/76.11 |
| 6,882,139 B2 * | 4/2005 | Grebner et al. | 324/158.1 |
| 7,248,066 B2 * | 7/2007 | Saraswat et al. | 324/763 |
| 7,353,442 B2 * | 4/2008 | Bahl et al. | 714/733 |
| 2005/0246602 A1 * | 11/2005 | Bahl et al. | 714/733 |
| 2008/0030186 A1 * | 2/2008 | Narayanan et al. | 324/76.39 |
| 2008/0231310 A1 * | 9/2008 | Vijayaraghavan et al. | 324/765 |

* cited by examiner

*Primary Examiner*—Jermele M Hollington
(74) *Attorney, Agent, or Firm*—Lisa K. Jorgenson; James H. Morris; Wolf, Greenfield & Sacks, P.C.

(57) ABSTRACT

The present invention provides a flexible on-chip testing circuit and methodology for measuring I/O characterization of multiple I/O structures. The testing circuit includes a register bank, a central processing controller (CPC), a character slew module, a delay characterization module, and a character frequency module. The register bank stores multiple instructions, and measurement results. The CPC fetches the instructions from the register bank. The CPC includes various primary and secondary state machines for interpreting the fetched instructions for execution. Depending on the input instruction the CPC applies stimulus to the IUT and the output of the IUT is used by the Local characterization modules (CHARMODULE) to extract the desired characterization parameters such as the character slew module which measures a voltage rise/fall time either for a single voltage IUT or a multi-voltage IUT. The Test Methodology for STIOBISC consists of an automated ATE pattern generation from verification test benches and automated result processing by converting the ATE data logs into the final readable format, thereby considerably reducing the test setup and output processing time. The testing circuit can operate in multiple modes for selecting one of these modules.

25 Claims, 9 Drawing Sheets

FLEXIBLE ON CHIP TESTING CIRCUIT FOR I/O'S CHARACTERIZATION

CROSS REFERENCE TO RELATED APPLICATIONS

This application is a continuation of U.S. application Ser. No. 11/875,837, filed Oct. 20, 2007 Entitled FLEXIBLE ON CHIP TESTING CIRCUIT FOR I/O'S CHARACTERIZATION, which application is incorporated herein by reference in its entirety.

BACKGROUND OF THE INVENTION

1. Field of the Invention

The present invention relates to chip testing circuits, and more specifically to a flexible on-chip testing circuit for I/Os characterization of different types of I/O structures.

2. Discussion of the Related Art

Input/Output (I/O) buffers are features of an integrated circuit which must be thoroughly tested because it is the I/O element which finally interfaces the core signal to the off-chip environment. The test of I/O circuitry involves measurement of various I/O pin DC and AC parameters. Since fabrication complexities have increased, hence tests have to be targeted not only to debug design related issues but also process related ones as considerable process spread is observed in newer technologies. This makes it mandatory for any design to be qualified on a large number of dies and wafers with emphasis on corner lot characterization. Such characterization test would require a sophisticated expensive tester and also increase test duration if the tests are performed manually. Embedded test features for macros such as memories have already proved to be an effective solution to expensive testers and parametric analyzers. Although commercial on-chip test solutions exist for other macros, most of the tests done today for the measurement of I/O pin parameters starting from the application of test patterns to the observation and compilation of results are manual thus making the tests, time intensive and prone to instrument errors. Moreover characterization tests are performed on a few packaged dies, which do not guarantee design robustness with process spread. Moreover not all features (such as maximum operating frequency of an input (IUT) can be measured at tester level.

Wafer-level tests, with their automated test programs offer an optimal solution in reducing the test time. Another key aspect is the time involved for debugging, when silicon results do not adhere to the specifications. This would require a very sophisticated tester thus enormously adding to the cost of test. On-chip I/O test and characterization structures, which facilitate board-level as well as wafer-level testing on a low-cost tester with minimum test duration address all the above mentioned challenges.

There are various parameters, which need to be analyzed for understanding special characteristics of the I/O structures. The parameters can be broadly classified as the DC parameters include output voltages and currents, the input voltage threshold levels and the pin leakage currents, whereas the Transient parameters include propagation delay, voltage rise/fall times of output I/Os (as they drive large off chip capacitances) and maximum frequency of operation of the I/O circuits in input as well as output modes. The frequency measurements can be of immense help to the core designer, as he/she exactly knows the limiting frequencies of I/Os for applying critical signals like clock and observing the output values. The above parameters often become extremely significant in a VLSI designing, like DRAM circuits, analog to digital converter (ADC) circuits, etc.

Therefore, there is need for a novel on-chip testing mechanism, which can provide a flexible on-chip characterization solution for different types of I/O structures. The novel mechanism employs an op-code based programmable test program and algorithms with a simple and standard Test Program/Tester Setup with automatic processing of tester results thereby resulting in an appreciable reduction in the test time. The mechanism is a cost effective approach for testing, and provides sufficient flexibility to measure D/C as well as A/C characteristics.

SUMMARY OF THE INVENTION

It is an object of the present invention to provide a flexible on-chip testing circuit for characterization of I/O pin parameters on a plurality of I/O structures.

It is another embodiment of the present invention to provide a circuit, which is flexible for on-chip measurement of I/O characterizations for a multi-voltage IUT, and a single voltage IUT.

To achieve the aforementioned objective, the present invention provides a flexible on-chip testing circuit for I/Os characterization of a plurality of I/O structures, said I/O structures comprising one of a multi-voltage IUT, and a single voltage IUT, said testing circuit utilizing a plurality of operational modes for measuring said I/Os characterization, said testing circuit comprising:

a Standard Test Interface providing a functional testing of the plurality of I/O structures and for interfacing a STIO-BISC with an external world;

a register bank module coupled to said standard test interface for storing a plurality of instructions, and for measuring a plurality of results;

a central processing controller (CPC) connected to said register bank module for fetching and executing the plurality of instructions, said controller comprising:

a plurality of secondary state machines for measuring said I/Os characterization; and a primary state machine interacting with the plurality of secondary state machines for interpreting the plurality of instructions;

one or more characterization modules controlled by said central processing controller and said register bank for measuring one or more parameters.

Further the present invention provides a method of I/Os characterization testing for a plurality of I/O structures through a flexible on chip testing circuit comprising:

loading a plurality of instructions into a register bank through a standard test interface port;

fetching and executing the plurality of instructions through a central processing controller (CPC), said instructions being stored in said register bank;

controlling a stimuli application to a plurality of IUTs through the central processing controller;

storing a plurality of results through one or more characterization modules;

shifting out the plurality of results through the standard test interface port; and processing the plurality of results through a custom tool to obtain characterization results.

DETAILED DESCRIPTION OF THE INVENTION

The present invention provides a cost-effective and flexible circuit and corresponding method for on-chip testing for I/O characterizations of different types of input and output I/O structures. The invention provides a flexible circuit for characterizing the pin parameters of I/O structures for a multi-voltage IUT, or a single voltage IUT.

Figure 1:
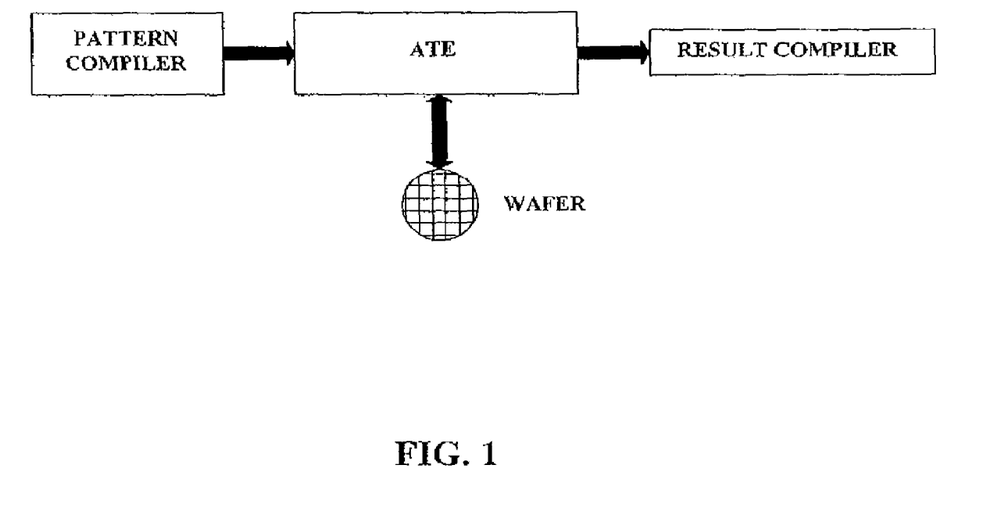
FIG. 1 illustrates a test setup of a flexible on-chip testing circuit for I/O characterization according to the present invention.

FIG. 1 illustrates a test setup of a flexible on-chip testing circuit for I/O characterization. A low speed and low cost Automatic test equipment (ATE) is used for generating the patterns required to initialize the setup for the logic inside the chip. STIOBISC can be used for I/O characterization at wafer level as well as package level. The 'ASSEMBLER' shown is a software program which gives an interactive and easy way to convert the patterns to be fed inside into required bit stream. The 'RESULT COMPILER' takes the output binary data from the ATE and converts them into the final test and characterization results, which can be directly read by the user.

Figure 2:
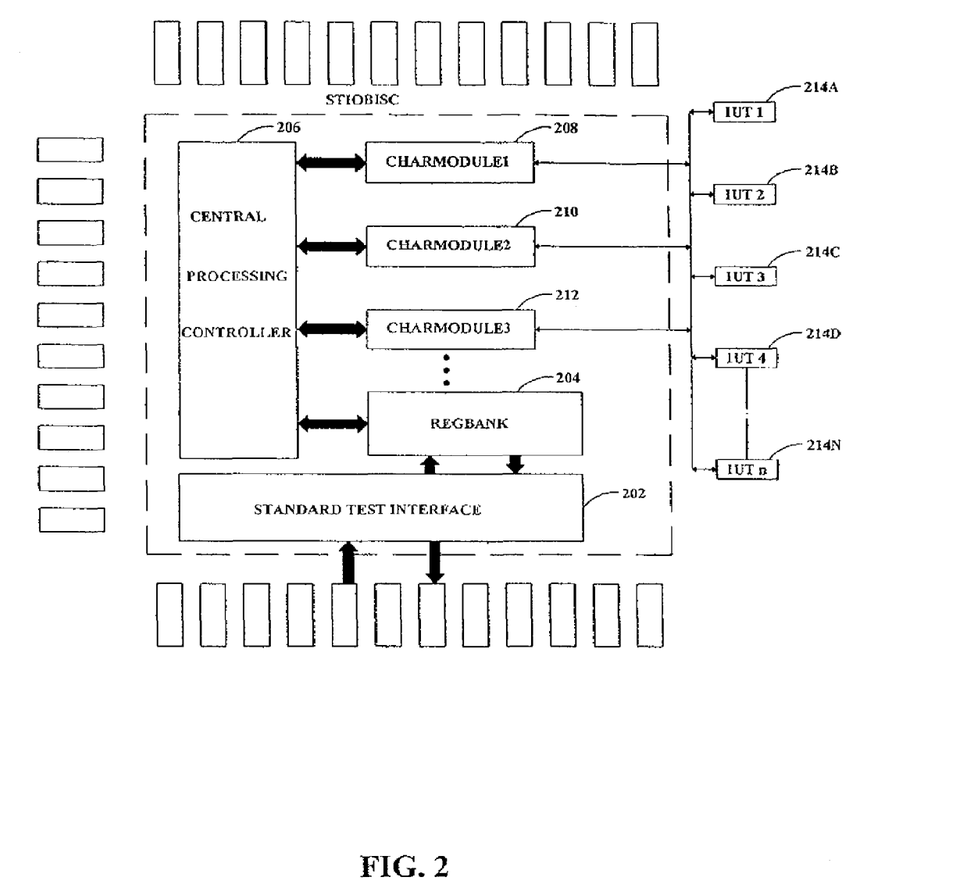
FIG. 2 illustrates a block diagram of a flexible on-chip testing circuit for I/O characterization according to the present invention.

FIG. 2 illustrates a block diagram of a flexible on-chip testing circuit for I/O characterization according to the present invention. The testing circuit includes a Standard Test Interface 202, a Register Bank module 204, a central processing controller (CPC) 206, and multiple characterization modules, such as 208 210 and 212. The standard test interface 102 is used to interface the hardware from an external world. The standard test interface 202 can be any standard test interface, such as the IEEE 1149.1 standard which has been implemented in STIOBISC. The IEEE1149.1 standard also helps in testing the I/Os for functionality before any characterization tests. Since STIOBISC is for characterizing the I/Os, hence a couple of additional analog ports may be required depending upon the parameter to be characterized. For this the IEEE1149.4 standard can be considered for use as a standard test interface.

The register bank module 204 stores a plurality of instructions fed through the Standard Test Interface 202 and the bank 204 also stores the results of the various measurements. The CPC 206 is a programmable controller and consists of a number of interconnected state machines. The main role of the CPC 206 is to implement the flow for each testing, debugging and characterisation command. The CPC 206 generates an operation sequence in a defined logical manner, which is explained afterwards. Apart for generating the sequence the CPC 206 monitors the logic for failure. If the logic fails due to hardware fault or wrong software programming (illegal opcodes) the CPC 206 tells the users about the failure. The CPC 206 also interacts with outside tester handshake signals. The algorithms on which various flows work have a very high degree of overlapping, making hardware sharing possible. The CPC 206 is designed in such a way that the Instruction code is easily expandable to include other on-chip test methodologies and any number of IUTs in future chips. The multiple characterization modules such as 208 210 and 212 each cater to a measurement of a particular I/O pin parameter such as a propagation delay, a voltage slew rate, a maximum operating frequency measurement, etc.

The present invention provides a circuit and method for on-chip testing and characterization by measuring the following I/O pin AC parameters:

1. Voltage rise and fall times of an input or output I/O (with CHARMODULE1 208 being the Custom Characterization Module).

2. Propagation delay of an I/O in a single mode (Input or Output) (with CHARMODULE2 210 being the Custom Characterization Module).

3. Maximum frequency of operation of an I/O and its corresponding duty cycle (with CHARMODULE3 212 being the Custom Characterization Module).

The general flow of operation of STIOBISC for the measurement of an I/O pin parameter is as follows:

1. Instruction corresponding to each test mode is fed in the register bank 204 via a TAP port or a Tap Data Input (TDI).

2. The CPC 204 interprets the instruction invokes its corresponding internal state machines and enables the corresponding characterization module 208.

3. The test is run and the results are stored in the internal registers of the register bank (206).

4. The stored data is then shifted out of the chip via a TAP port or a Tap Data Output (TDO).

In an embodiment of the present invention, the test circuit has been implemented in a 90 nm CMOS technology testchip with a central processing controller operates according to a 9 bit instruction code—INSTR as mentioned in Table 1, which comprises of a 3 bit operation code as mentioned in Table 2.

TABLE 1

Specification of the Instruction Code

| Instruction | Usage |
|---|---|
| INSTR[8:6] | Opcode which specifies the type of test to be run. |
| INSTR[5] | Specifies whether the delay & Voltage Rise/Fall times measurements are to be done for Rising or falling signal transitions. |
| INSTR[4:0] | 5 bits for selecting the IUTs for which the timing parameters are to be measured |

TABLE 2

Representative Set of OP-codes

| Opcode | Binary Value | Operation |
|---|---|---|
| FLUSH | 000 | Flush all contents of REGBANK and other registers in CPC. All stored results are available in serial format through the TDO port of TAP. |
| PDLAY | 001 | Measure Propagation Delay |
| SLEWR | 010 | Measure Voltage Slew rate |

TABLE 2-continued

Representative Set of OP-codes

| Opcode | Binary Value | Operation |
| --- | --- | --- |
| FREQ | 011 | Measure Maximum Frequency of operation with corresponding Duty Cycle. |
| CHARA | 100 | STIOBISC Self Calibration mode |
| DEBUG | 101 | Self Debug Mode for debugging failures/anomalies in the STIOBISC logic, if any. |

As an embodiment of on-chip characterization measurement of I/O pin parameters using STIOBISC, the measurement circuit and methodology for the voltage slew rate measurement of a multi-voltage output IUT is explained below.

Figure 3:
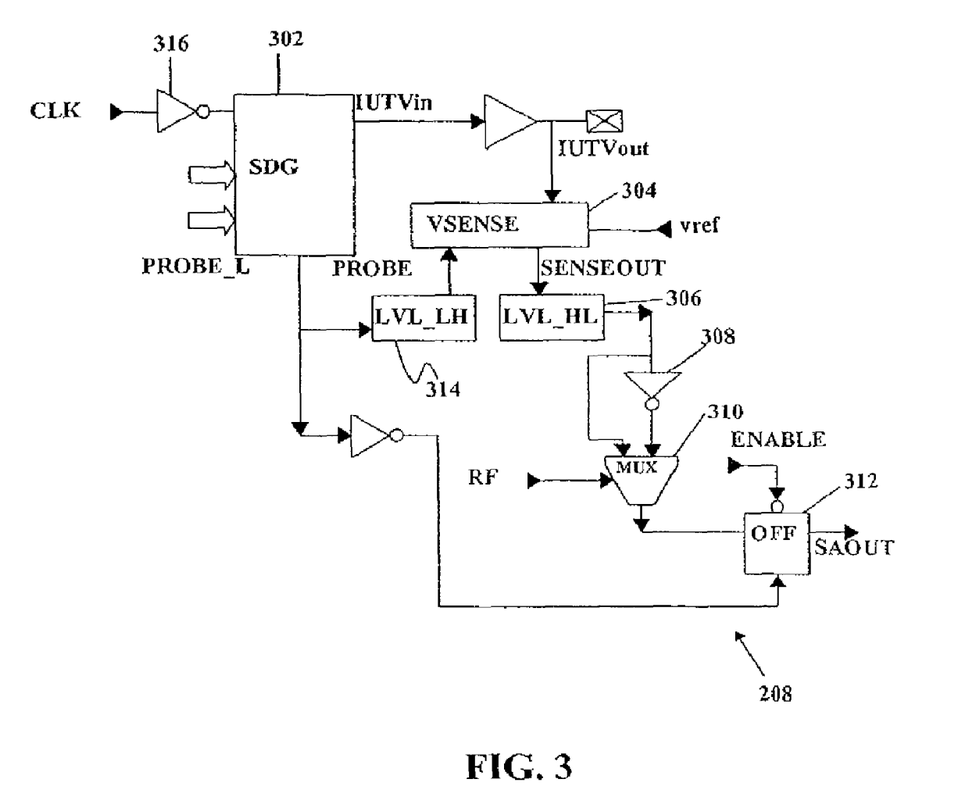
FIG. 3 illustrates a block diagram of a character slew module for measuring a voltage rise/fall time for a multi-voltage IUT according to the present invention.

FIG. 3 illustrates a block diagram of the character slew module 208 for measuring a voltage rise/fall time for a multi-voltage IUT according to the present invention. The measurement methodology can be described by way of an illustration. The rise time of a signal between 10% and 90% of a supply voltage Vdde is to be measured. The methodology consists of a discrete time sampling of voltage levels of an output pin of the IUT, and comparing it with a reference voltage Vref. The reference voltage can either be taken from an external source or through an on-chip voltage generator (this would save an analog port). In the present system, the 'Vref' is obtained from an analog port. First the circuit is run to detect the time (relative to a fixed start time) at which a signal at the output pin of the IUT reaches 10% of 'Vdde'. This time is available in a binary format, which can be shifted out through a TAP interface. The circuit is then run to detect the time at which said output pin of the IUT reaches 90% of Vdde. Again this time is obtained in a binary format. The difference of these two binary values gives the rise time in binary format. This binary value when applied to a Binary Slew to Time Conversion (BSTC) formula gives the Rise time in nanoseconds.

The character slew module 208 primarily includes a stepped delay generator (SDG) 302 and a voltage comparator (VSENSE) 304. In an embodiment of the present invention, the two voltage level shifters are not required, if the IUT is of a single-voltage type. The SDG 302 takes a system clock (CLK) as input and generates two clocks, one which is either a buffered or inverted version (IUTVin) and the other which is a programmable time delayed version (PROBE_L) with respect to the other generated clock. In the operation of the module 208, the block 304 compares the voltage on an output pin IUTVout of the IUT, with a reference voltage (Vref) at a rising edge of a PROBE signal (level shifted version of PROBE). The voltage comparator 304 is a sense-amplifier as illustrated in FIG. 3.

The voltage comparison between the IUTVout and the Vref takes place at the positive edge of the PROBE signal and an output is obtained at a pin SENSEOUT of the voltage comparator 304. The inversion of the PROBE signal is represented by PROBE_B. Therefore, at an instance, when the PROBE signal is high and if the IUTVout is less than the Vref then, the SENSEOUT will resolve to the supply voltage Vdde. Otherwise it will resolve to a ground voltage Gnd.

In another embodiment of the present invention, the character slew module 208 is applied for measuring I/O characterizations for a multi-voltage IUT. A sense-amplifier has to be made with transistors and the supply voltage, which corresponds to a pad voltage of the IUT. Therefore, a low to high voltage level shifter LVL_LH 314 is used to convert the PROBE_L signal to a pad voltage –PROBE and a high to low level shifter LVL_HL 306 is used to scale the SENSEOUT to a core voltage.

The methodology involves strobing an output signal IUTVout, across multiple cycles of the input signal at various voltage levels during transition of the IUTVout. It is assumed that the Rise/Fall time remains constant for a particular IUT across multiple input cycles at a given condition of process, voltage and temperature (PVT). Multiple cycles are given as input to the IUT and in each cycle the output pin of IUT is strobed at a particular voltage level and compared with the Vref. This strobing signal, the PROBE_L, is controlled in such a manner that in each cycle the position of the PROBE_L is shifted by a definite step value governed by a 10 bit STEPDELAY input bus of the SDG 302. This STEPDELAY bus is controlled by the central processing controller, which employs a specific algorithm to increment the step delays.

Depending whether a rise or a fall time measurement is to be done, an inverter 308 and a multiplexer 310 is configured in such a way that its output always toggles from logic '0' to logic '1', whenever the IUTVout crosses the Vref in any direction. The output of the multiplexer 310 is then sampled by a Flip-Flop (DFF) 312, whose clock is an inversion of the PROBE_L signal. In an embodiment of the present invention, the flip-flop 312 is a delay (D) type flip flop. Thus, after sampling the IUTVout signal at the positive edge of PROBE_L, the output SENSEOUT is latched at the negative edge of the PROBE_L. The output signal SAOUT of the flip flop circuit 312 is then sampled by a central processing controller (CPC) at the next positive edge of a clock and depending on the logic value of the SAOUT, it is decided whether to increment the STEPDELAY or not.

The Voltage Rise/Fall time measurements are critical to output I/O buffers as they are used to drive large off chip capacitive loads. Therefore, it is imperative that these I/Os are checked to ascertain whether they are able to meet the requisite Voltage Rise/Fall times for a given capacitive load. The present system employs an on-chip circuitry to calculate the Rise/Fall time of an output IUT. A unique measurement methodology is employed which facilitates contact-less measurement of Voltage Rise/Fall times. Thus the test supports reduced pin count testing which can be done even on a low cost tester.

Figure 4:
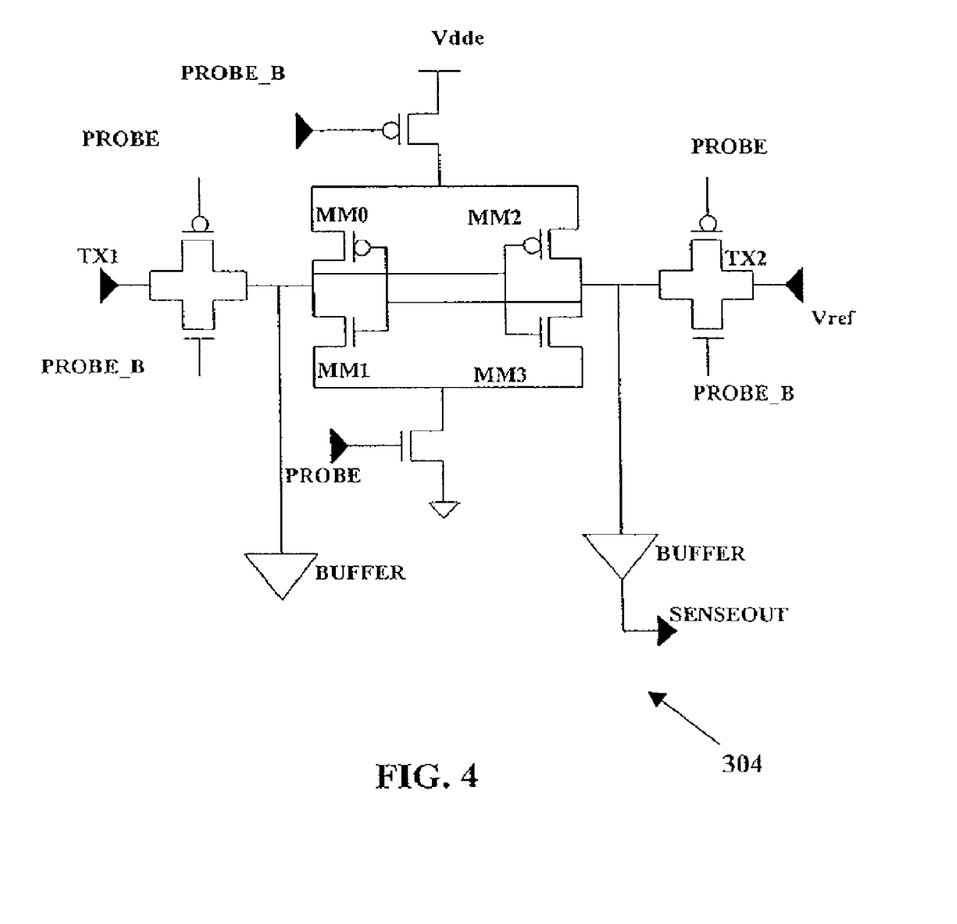
FIG. 4 illustrates a circuit diagram of a voltage comparator according to an embodiment of the present invention.

FIG. 4 illustrates a circuit diagram of the voltage comparator 304 according to an embodiment of the present invention.

Figure 5:
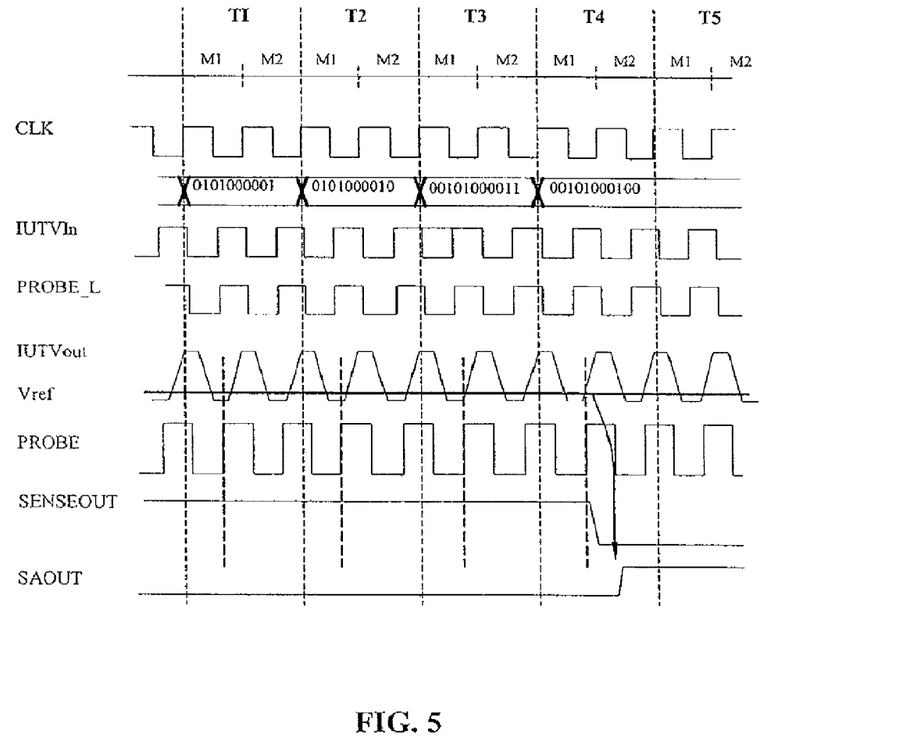
FIG. 5 illustrates a timing diagram for a voltage detection mechanism according to the present invention.

FIG. 5 illustrates a timing diagram for a voltage detection mechanism according to the present invention. The central processing controller (CPC) 206 increments the STEPDELAY after 2 clock cycles. As a T cycle (T1, T2, etc.) with each T cycle consisting of two clock cycles M1 and M2. During each T cycle, at the positive edge of M1 clock, the Central controller samples for the SAOUT signal. If the SAOUT is logic '1', the controller stops incrementing the STEPDELAY bits, as that would be the binary value at which the IUTVout just crossed the Vref. If SAOUT is at logic '0', then the controller 206 increment the STEPDELAY bits.

During the first half of M1, the SDG 302 gets tuned to a new value of STEPDELAY. At the negative edge of M1, a positive edge of the PROBE_L signal is generated, which compares the IUTVout with the Vref. The output of the comparison SENSEOUT is then latched by the flip flop circuit 312 at the negative edge of PROBE_L which occurs after the positive edge of M2 cycle and is available as the SAOUT. In the diagram shown in FIG. 5, in the T cycle T4, the IUTVout just crosses the Vref at the sampling edge of the PROBE signal.

The delay increment between two consecutive step sizes in the SDG 302 is an inverter delay and the range of the SDG 302 has been kept up to 20 ns to accommodate large IUT output transitions. Incrementing the 11 bit STEPDELAY bus serially for large transitions, say by 15 ns ($2^{11}$ T cycles), would result in a very large test program time. Therefore, to considerably reduce the test program time, a customized binary convergence algorithm has been incorporated in the central controller (CPC) 206 to increment the STEPDELAY bus. This algorithm results in the measurement of output transitions using a maximum of 52 T cycles or 52*2=104 clock cycles only, thus resulting in a huge reduction in a test time.

The above mentioned procedure is then repeated with the Vref kept at 90% of pad supply voltage. The difference of the two binary STEPDELAY values obtained gives the rise time of the IUT from 10% to 90% of the pad supply voltage in binary format. The voltage fall time can also be similarly measured by just inverting the transitions at the IUTVin pin with respect to the PROBE_L.

Before the test for IUT is done, the SDG 302 is self calibrated and its output is used to formulate a Binary Slew to Time Conversion (BSTC) formula which converts binary value to time domain and thus gives the Voltage Rise/Fall in nanoseconds.

Figure 6:
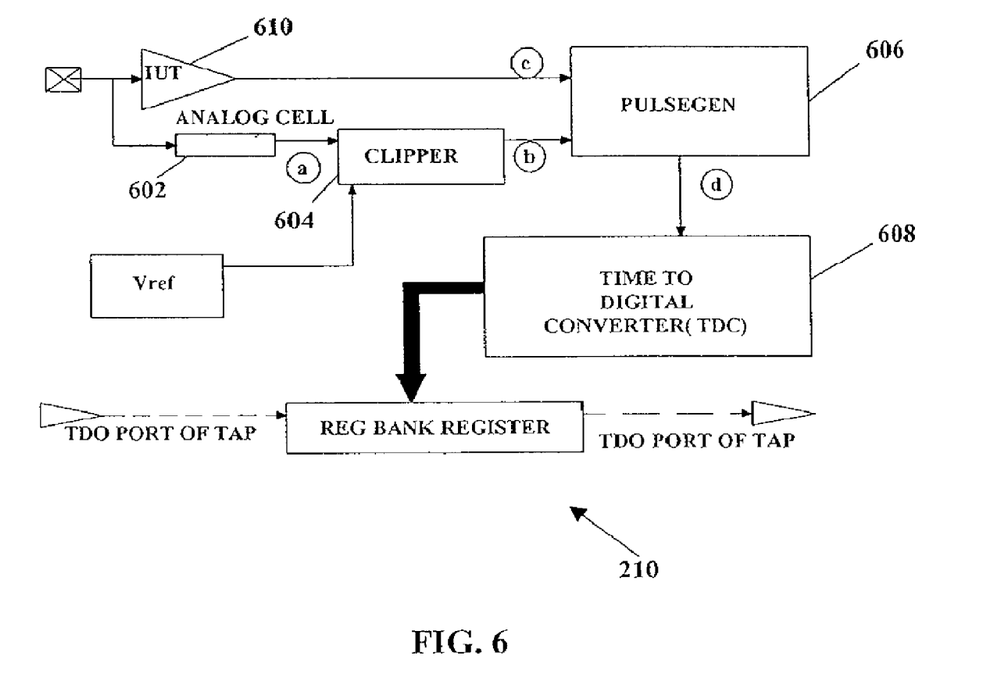
FIG. 6 illustrates a block diagram for a delay characterization module for measuring a propagation delay of a multi-voltage input I/O cell according to the present invention.

FIG. 6 illustrates a block diagram for the delay characterization module 210 for measuring a propagation delay according to the present invention. The delay characterization module 210 can be used for multi-voltage I/Os (with different pad and core voltages), and single-voltage I/Os. The module 210 utilizes a methodology, which consists of sampling the signals at the input and output of the IUT and producing a pulse whose pulse width is equal to the time difference between the two sampled signals. A signal from a pad side of an IUT terminal 610 is brought inside the chip via an analog cell 602. Each IUT has a dedicated analog cell associated with it and the pad side pin of the analog cell is shorted with the pad side pin of the IUT. This has been done to propagate the pad side signal (given to the IUT 610) directly to the core via the analog cell 602. The analog cell 602 is just a wire with a small finite series resistance (couple of K ohms) and provides an Electrostatic Discharge (ESD) protection. The ESD protection is required as the pad voltage is going directly to internal blocks of the chip. Also this finite series resistance helps to provide latch-up protection for CMOS cells taking this signal as input.

Figure 7:
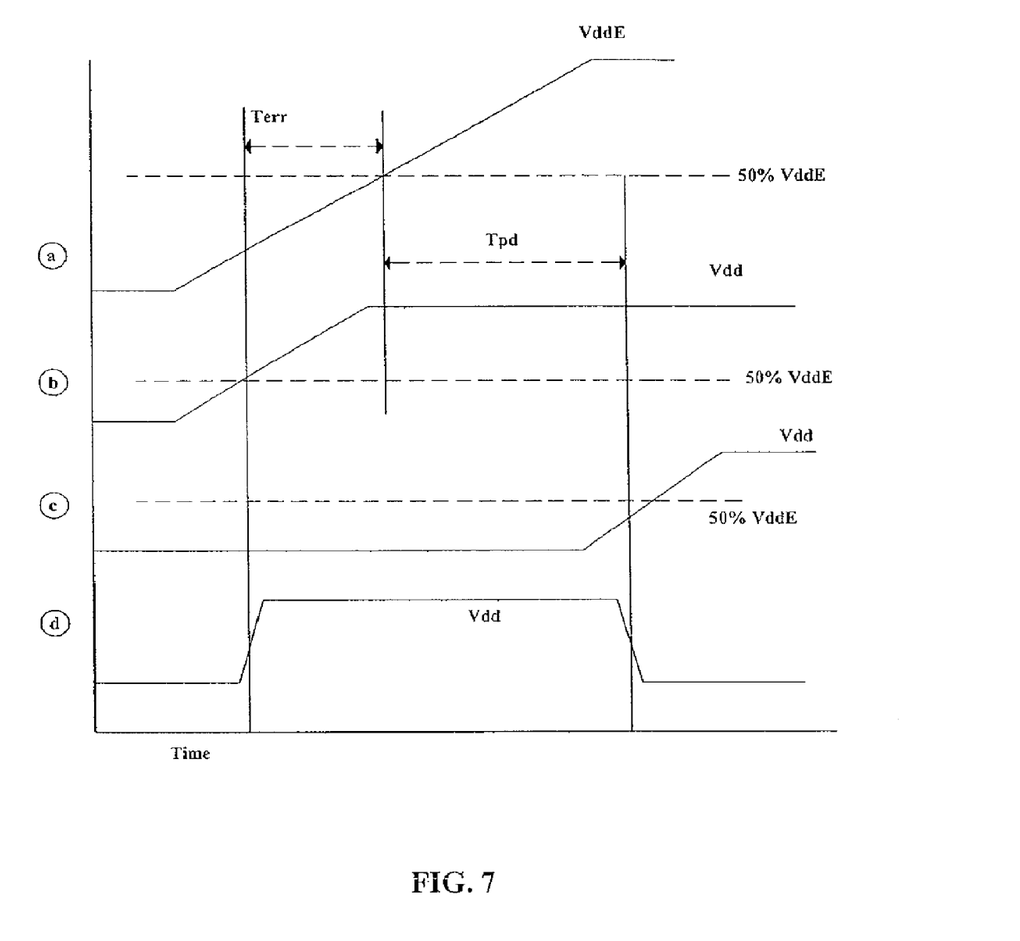
FIG. 7 illustrates a timing diagram of pulse generation in a delay characterization module according to the present invention.

The waveforms at points 'a', 'b', 'c' and 'd' are illustrated in FIG. 7. In case of multi-voltage I/Os, the input signal of the IUT 610, after crossing the analog cell 602, wave 'a' is fed to a voltage clipping circuit CLIPPER 604, which clips the pad voltage Vdde to a voltage level corresponding to a core supply Vdd. This is depicted by wave 'b'. The voltage at which the input signal should clip in the CLIPPER circuit 604 is governed by a voltage (Vref) applied at the analog pin. The reference voltage Vref can either be taken from an external source or through an on-chip voltage generator (this would save an analog port). The Propagation Delay is defined as the difference of the time when the output reaches a certain threshold (usually 50% of supply) and the time when the applied input reaches a certain threshold (50% of supply). The module 210 measures a delay using 50% of supply voltage as threshold. The output of the CLIPPER circuit 604 is now fed to a PULSEGEN circuit 606, which produces a pulse whose width corresponds to the delay of the IUT. This is depicted by wave 'd' in FIG. 7.

As illustrated in FIG. 7, the actual propagation delay of the IUT is Tpd, whereas the pulse formed is equal to Tpd+Terr. Since the input transition time at the tester is known, therefore, Terr can be calculated mathematically from the tester slope value. The Terr is finally subtracted from the measurement result. In case of a falling input transition, the Terr can be similarly found and added to the measured value. The pulse is then fed to a Time to Digital Converter (TDC) 608 which converts the pulse width time to binary equivalent.

Before the test for IUT is done, the TDC 608 is self calibrated and its output is used to formulate a Binary to Time Domain Conversion (BTDC) formula for the TDC 608 which converts binary value obtained during delay measurement to time domain, and thus gives the pulse width in nanoseconds.

The TDC 608 is a central block, while the CLIPPER 604 and PULSEGEN circuits 606 are dedicated for each IUT and placed close to it. Special measures have been taken during the place and route to ensure that the pulse that travels from each PULSEGEN 506 to the TDC 608 retains its pulse width with an error of 0.2%. The individual pulses are then selected using a Selection Logic Block (pulse is retained with an error of 0.1%) and its output is sent to the TDC circuit 608.

Figure 8:
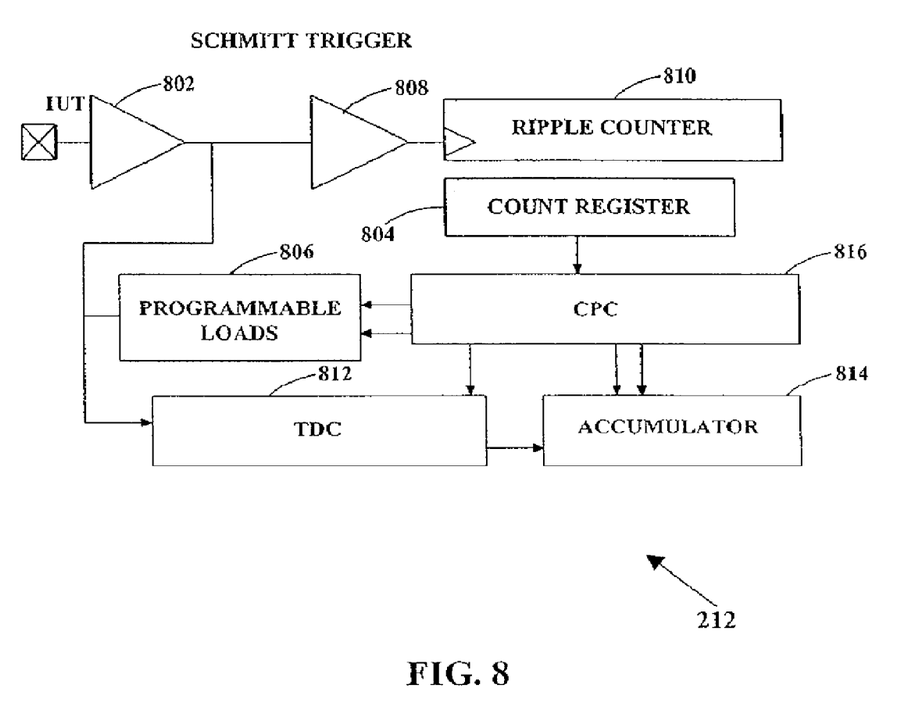
FIG. 8 illustrates a schematic block diagram of a character frequency module for measuring a maximum operating frequency and its corresponding duty cycle in an I/O cell according to the present invention.

FIG. 8 illustrates a schematic block diagram of the character frequency module 212. The character frequency module 212 measures the maximum operating frequency and its corresponding duty cycle in an input I/O cell. The character frequency module 212 is derived from the co pending patent application number 1785/DEL/96 filed on Aug. 4, 2006.

Figure 9:
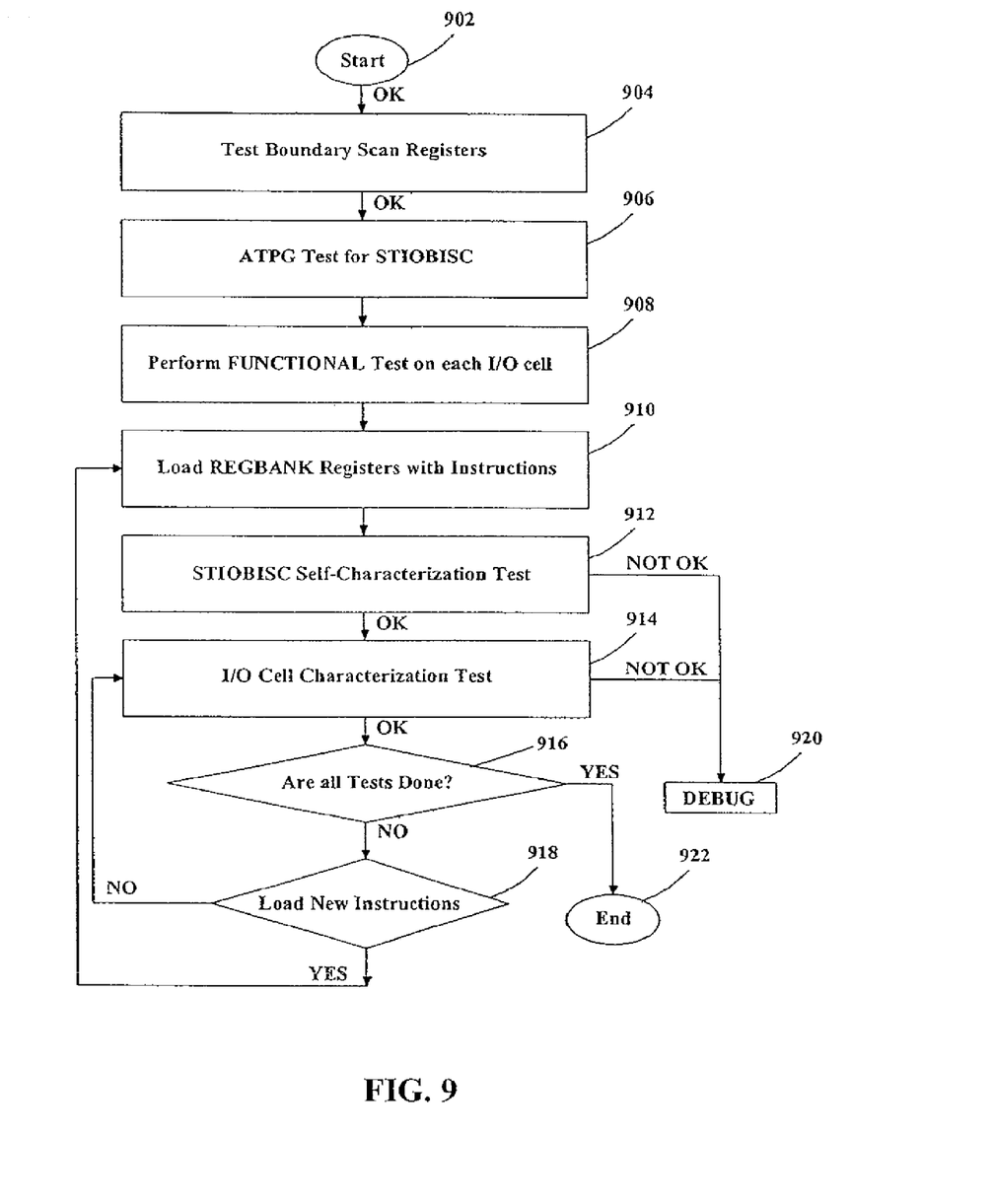
FIG. 9 illustrates a flow diagram of a method for I/O's characterization testing according to the present invention.

FIG. 9 illustrates a flow diagram of a method for I/O's characterization testing according to the present invention. The flow chart explains the overall procedural steps for I/O's characterization testing.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A flexible on-chip testing circuit for I/Os characterization of a plurality of I/O structures, said I/O structures comprising one of a multi-voltage IUT, and a single voltage IUT, said testing circuit utilizing a plurality of operational modes for measuring said I/Os characterization, said testing circuit comprising:
   a Test Interface providing a functional testing of the plurality of I/O structures and for interfacing with an external world;
   a register bank module coupled to said standard test interface for storing a plurality of instructions, and for measuring a plurality of results;
   a central processing controller (CPC) connected to said register bank module for fetching and executing the plurality of instructions, said controller comprising:
      a plurality of secondary state machines for measuring said I/Os characterization; and
      a primary state machine interacting with the plurality of secondary state machines for interpreting the plurality of instructions; and
   one or more characterization modules controlled by said central processing controller and said register bank for measuring one or more parameters.

2. The flexible on-chip testing circuit of claim 1, wherein said Test Interface comprises an IEEE1149.1 logic.

3. The flexible on-chip testing circuit of claim 1, wherein the one or more parameters are selected from a group comprising a propagation delay, and a voltage slew rate.

4. The flexible on-chip testing circuit of claim 1 further comprising an analog I/O port for applying an analog voltage.

5. The flexible on-chip testing circuit of claim 1 further comprising a test access port (TAP) for receiving and transmitting the plurality of instructions.

6. The flexible on-chip testing circuit of claim 5, wherein said test access port comprises one of a tap data input port (TDI), and a tap data output port (TDO).

7. The flexible on-chip testing circuit of claim 1, wherein the one or more characterization modules comprises a character slew module for measuring a voltage rise time, and a voltage fall time of a multi-voltage IUT.

8. The flexible on-chip testing circuit of claim 7, wherein said character slew module comprises:
   a stepped delay generator (SDG) receiving an input clock to generate an inverted version signal (IUTVin), and a programmable time delayed version signal (PROBE_L), said generator being controlled by said central processing controller;
   a voltage comparator comparing a reference voltage, and an output inversion voltage (IUTVout) to generate an output voltage;
   a low to high voltage level shifter for scaling said time delayed signal (PROBE_L) to a pad voltage (PROBE);
   a high to low voltage level shifter for scaling the output voltage signal to a core voltage signal;
   an inverter and a multiplexer providing a toggle from a logic '0' to logic '1' to said output voltage, when said output inversion voltage (IUTVout) crosses said reference voltage; and
   a flip flop circuit utilizing an inverted time delayed clock signal for sampling an output signal from said multiplexer.

9. The flexible on-chip testing circuit of claim 1, wherein the one or more characterization modules comprises a delay characterization module for measuring a propagation delay of a multi-voltage input I/O cell.

10. The flexible on-chip testing circuit of claim 9, wherein said delay characterization module comprising:
    an IUT terminal for receiving input signals from a pad;
    an analog cell connected to said IUT terminal for transmitting said signals to a core, said cell providing an EDS protection;
    a clipping circuit receiving an output from said analog cell for reducing a pad voltage level to a core voltage level, said clipping circuit utilizing a reference voltage (Vref);
    a pulse generator circuit receiving an output from said clipping circuit for generating a pulse signal corresponding to an IUT delay; and
    a time to delay converter receiving said pulse signal to convert from a pulse width time to a binary value.

11. The flexible on-chip testing circuit of claim 10, wherein said analog cell comprises a small finite series resistance to provide a latch-up protection for a CMOS cell.

12. A method of I/Os characterization testing for a plurality of I/O structures through a flexible on chip testing circuit, the method comprising:
    loading a plurality of instructions into a register bank through a standard test interface port;
    fetching and executing the plurality of instructions through a central processing controller (CPC), said instructions being stored in said register bank;
    controlling a stimuli application to a plurality of IUTs through the central processing controller;
    storing a plurality of results through one or more characterization modules, each characterization module measuring one or more parameters;
    shifting out the plurality of results through the standard test interface port; and
    processing the plurality of results to obtain characterization results.

13. An on-chip testing circuit, for inclusion in an integrated circuit, to test functionality of the integrated circuit, the on-chip testing circuit comprising:
    an interface to receive input regarding testing to be performed and to provide output regarding results of testing;
    at least one memory element storing the input received via the interface and the output to be provided via the interface;
    at least one characterization module each measuring at least one corresponding performance characteristic of the integrated circuit,
    a controller, connected to the at least one memory element, to perform a test indicated by the input stored in the at least one memory element by:
        executing a set of instructions corresponding to the test indicated by the input;
        measuring at least one performance characteristic of the integrated circuit by controlling operations of the at least one characterization module measuring the at least one performance characteristic; and
        storing the results of the test in the at least one memory element.

14. The on-chip testing circuit of claim 13, wherein the at least one memory element stores sets of instructions for carrying out at least one test, the at least one test including at least one of tests to determine a propagation delay, a voltage rise and fall time, and maximum frequency of operation of the integrated circuit.

15. The on-chip testing circuit of claim 13, wherein each characterization module of the at least one characterization module is a characterization circuit measuring the at least one corresponding performance characteristic,
    wherein the controller measures the at least one performance characteristic by controlling operations of the at least one characterization circuit measuring the at least one performance characteristic.

16. The on-chip testing circuit of claim 13, wherein the at least one characterization module comprises a characterization slew module for measuring a voltage rise time and a voltage fall time of the integrated circuit,
    wherein, when the test indicated by the input is a test of a voltage rise and fall time, the controller controls operations of the characterization slew module to determine the voltage rise and fall time of the integrated circuit.

17. The on-chip testing circuit of claim 13, wherein the at least one characterization module comprises a propagation delay module for measuring a propagation delay of the integrated circuit,
    wherein, when the test indicated by the input is a test of a propagation delay, the controller controls operations of the propagation delay module to determine the propagation delay of the integrated circuit.

18. The on-chip testing circuit of claim 13, wherein the controller stores the results of the test by storing the at least one performance characteristic in the at least one memory element.

19. The on-chip testing circuit of claim 13, wherein the controller stores the results of the test by comparing the at least one performance characteristic to an expected value and storing a result of the comparison in the at least one memory element.

20. The on-chip testing circuit of claim 19, wherein the controller stores the result of the comparison by storing an indication of whether the integrated circuit has passed the test.

21. The on-chip testing circuit of claim 19, wherein the controller stores the result of the comparison by storing a property of the integrated circuit identified from the comparison.

22. The on-chip testing circuit of claim 13, wherein the at least one memory element comprises a register bank.

23. A flexible on-chip testing circuit for I/Os characterization of a plurality of I/O structures, said I/O structures comprising one of a multi-voltage IUT, and a single voltage IUT, said testing circuit utilizing a plurality of operational modes for measuring said I/Os characterization, said testing circuit comprising:
- a Test Interface providing a functional testing of the plurality of I/O structures and for interfacing with an external world, the Test Interface comprising an analog I/O port for applying an analog voltage;
- a register bank module coupled to said standard test interface for storing a plurality of instructions, and for measuring a plurality of results;
- a central processing controller (CPC) connected to said register bank module for fetching and executing the plurality of instructions, said controller comprising:
  - a plurality of secondary state machines for measuring said I/Os characterization; and
  - a primary state machine interacting with the plurality of secondary state machines for interpreting the plurality of instructions; and
- one or more characterization modules controlled by said central processing controller and said register bank for measuring one or more parameters.

24. A flexible on-chip testing circuit for I/Os characterization of a plurality of I/O structures, said I/O structures comprising one of a multi-voltage IUT, and a single voltage IUT, said testing circuit utilizing a plurality of operational modes for measuring said I/Os characterization, said testing circuit comprising:
- a Test Interface providing a functional testing of the plurality of I/O structures and for interfacing with an external world;
- a register bank module coupled to said standard test interface for storing a plurality of instructions, and for measuring a plurality of results;
- a central processing controller (CPC) connected to said register bank module for fetching and executing the plurality of instructions, said controller comprising:
  - a plurality of secondary state machines for measuring said I/Os characterization; and
  - a primary state machine interacting with the plurality of secondary state machines for interpreting the plurality of instructions; and
- one or more characterization modules controlled by said central processing controller and said register bank for measuring one or more parameters, wherein the one or more characterization modules comprises a character slew module for measuring a voltage rise time, and a voltage fall time of a multi-voltage IUT.

25. The flexible on-chip testing circuit of claim 24, wherein said character slew module comprises:
- a stepped delay generator (SDG) receiving an input clock to generate an inverted version signal (IUTVin), and a programmable time delayed version signal (PROBE_L), said generator being controlled by said central processing controller;
- a voltage comparator comparing a reference voltage, and an output inversion voltage (IUTVout) to generate an output voltage;
- a low to high voltage level shifter for scaling said time delayed signal (PROBE_L) to a pad voltage (PROBE);
- a high to low voltage level shifter for scaling the output voltage signal to a core voltage signal;
- an inverter and a multiplexer providing a toggle from a logic '0' to logic '1' to said output voltage, when said output inversion voltage (IUTVout) crosses said reference voltage; and
- a flip flop circuit utilizing an inverted time delayed clock signal for sampling an output signal from said multiplexer.

* * * * *